United States Patent [19]

Izumi

[11] Patent Number: 5,255,233
[45] Date of Patent: Oct. 19, 1993

[54] NON-VOLATILE SEMICONDUCTOR MEMORY DEVICE EQUIPPED WITH SENSE AMPLIFIER CIRCUIT FOR DISCRIMINATING SMALL DIFFERENTIAL VOLTAGE LEVEL

[75] Inventor: Kyouichi Izumi, Kanagawa, Japan

[73] Assignee: NEC Corporation, Tokyo, Japan

[21] Appl. No.: 891,807

[22] Filed: Jun. 1, 1992

[30] Foreign Application Priority Data

Jun. 10, 1991 [JP] Japan .................. 3-137327

[51] Int. Cl.$^5$ ............... G05F 3/24; G11C 7/02
[52] U.S. Cl. .................. 365/207; 365/189.09; 365/206; 365/196
[58] Field of Search .......... 365/189.06, 206, 207, 365/196

[56] References Cited

U.S. PATENT DOCUMENTS

| | | | |
|---|---|---|---|
| 4,907,201 | 3/1990 | Minami et al. | 365/207 |
| 5,029,138 | 7/1991 | Iwashita | 365/207 |
| 5,109,187 | 4/1992 | Guliani | 365/189.09 |

*Primary Examiner*—Eugene R. LaRoche
*Assistant Examiner*—Viet Q. Nguyen
*Attorney, Agent, or Firm*—Laff, Whitesel, Conte & Saret

[57] ABSTRACT

An electrically programmable read only memory device changes the threshold voltage level of each memory cell depending upon logic level of a data bit for producing a read-out voltage level indicative of the data bit, and a sense amplifier unit changes the read-out voltage level and a reference voltage level into first and second current by means of first and second current mirror circuits so that a third current mirror circuit controls a voltage level converted from the first current on the basis of a voltage level converted from the second current, wherein the sense amplifier unit further comprises a differential amplifier circuit responsive to the voltage levels respectively converted from the first and second currents so as to discriminate small difference in threshold level of each memory cell, thereby allowing a programming to be completed within relatively short time period.

8 Claims, 6 Drawing Sheets

NON-VOLATILE SEMICONDUCTOR MEMORY DEVICE EQUIPPED WITH SENSE AMPLIFIER CIRCUIT FOR DISCRIMINATING SMALL DIFFERENTIAL VOLTAGE LEVEL

FIELD OF THE INVENTION

This invention relates to a non-volatile semiconductor memory device and, more particularly, to a current mirror type sense amplifier circuit incorporated in an electrically programmable read only memory device.

DESCRIPTION OF THE RELATED ART

In an electrically programmable read only memory device, high and low threshold levels correspond to two logic levels of a data bit, and the memory cells are variable in threshold level through electron injection and ultra-violet light radiation. When the injected electrons lift the threshold level of a memory cell, the memory cell enters programmed state, and any current flows through the memory cell under the application of a read-out voltage level. However, after the ultra-violet light radiation evacuates the injected electrons from the memory cell, the memory cell enters erased state, and the lowered threshold level allows current to flow therethrough under the application of the read-out voltage level. Thus, the state of a memory cell is detectable by monitoring current.

FIG. 1 shows a typical example of an electrically programmable read only memory device with non-volatile memory cells each implemented by a floating gate type field effect transistor. The prior art electrically programmable read only memory device largely comprises a memory cell array 1 associated with word lines WL1 to WLm as well as with digit line DL1 to DLn, a row address decoding unit 2 coupled with the word lines WL1 to WLm, a column selecting unit 3 coupled with the digit lines DL1 to DLn, a column address decoding unit 4 coupled with the column selecting unit 3 through decoded signal lines DS1 to DSn, a reference unit 5 and a sense amplifier unit 6.

The memory cell array 1 is constituted by a plurality of non-volatile memory cells M11, M1n, Mm1 and Mmn arranged in rows and columns, and each of the non-volatile memory cells M11 to Mmn is implemented by an n-channel floating gate type field effect transistor. The n-channel floating gate type field effect transistors selectively enter the erased state and the programmed state, and the programmed state and the erased state are respectively corresponding to logic "1" level and logic "0" level at a data output node OUT. In order to memorize a data bit of logic "1" level into one of the non-volatile memory cells M11 to Mmn, electrons are injected into the floating gate electrode of the n-channel floating gate type field effect transistor of the memory cell, and the non-volatile memory cell, then, enters the programmed state featured by a high threshold level. However, when ultra-violet light is radiated onto the memory cell array 1, electrons are evacuated from the floating gate electrodes of all the n-channel floating gate type field effect transistors, and the non-volatile memory cells M11 to Mmn simultaneously enter the erased state featured by a low threshold level.

The rows of the memory cell array 1 are associated with the word lines WL1 to WLm, and the word lines WL1 to WLm are coupled with the control gate electrodes of the associated n-channel floating gate type field effect transistors. The digit lines DL1 to DLn are respectively associated with the columns of the memory cell array 1, and are coupled with drain nodes of the associated n-channel floating gate type field effect transistors. The digit lines DL1 to DLn are terminated at the column selector unit 3, and the column selector unit 3 are implemented by a plurality of n-channel enhancement type field effect transistors Q31 to Q3n coupled with the digit lines DL1 to DLn. The source nodes of all the n-channel floating gate type field effect transistors are coupled with a ground voltage line.

When the row address decoder unit 2 lifts one of the word lines WL1 to WLm to a read-out voltage level regulated between the relatively high threshold level and the relatively low threshold level, the associated n-channel floating gate type field effect transistors selectively turn on depending upon the state thereof, and n-channel floating gate type field effect transistors in the erased state couple the associated digit lines DL1 to DLn with the ground voltage line. The column address decoder unit 4 allows one of the n-channel enhancement type field effect transistors Q31 to Q3n to turn on, and interconnects one of the digit lines DL1 to DLn and a data input node N1 of the sense amplifier unit 6.

The reference unit 5 is implemented by a series combination of an n-channel enhancement type field effect transistor Q51 and an n-channel floating gate type field effect transistor Q52 coupled between a reference node N2 of the sense amplifier unit 6 and the ground voltage line. The n-channel floating gate type field effect transistor Q52 is approximately equal in current driving capability to each of the n-channel floating gate type field effect transistors of the memory cell array 1, and the n-channel enhancement type field effect transistor Q51 is approximately equal in current driving capability to each of the n-channel enhancement type field effect transistors Q31 to Q3n. A positive power voltage level is applied to the gate electrode of the n-channel enhancement type field effect transistor Q51 and to the control gate electrode of the n-channel floating gate type field effect transistor Q52, and, accordingly, both n-channel enhancement type and n-channel floating gate type field effect transistors Q51 and Q52 turn on at all times.

The sense amplifier unit 6 comprises two inverting circuits 61a and 61b coupled at the input nodes thereof with the data input node N1 and the reference node N2, two n-channel enhancement type gate transistors 62a and 62b respectively gated by the inverting circuits 61a and 61b, first and second current mirror circuits 63a and 63b coupled between a power voltage source Vcc and the n-channel enhancement gate transistors 62a and 62b, a third current mirror circuit 64 associated with the first and second current mirror circuits 63a and 63b, and an output inverting circuit 65 coupled between the third current mirror circuit 54 and the data output node OUT.

The first current mirror circuit 63a is implemented by a pair of p-channel enhancement type field effect transistors Qp61 and Qp62, and the gate electrodes of the pair of p-channel enhancement type field effect transistors Qp61 and Qp62 are coupled with the drain node N3 of the p-channel enhancement type field effect transistor Qp61. The amount of current passing through each p-channel enhancement type field effect transistor Qp61 or Qp62 is varied with the voltage level at the drain node N3, and currents are supplied from the first current mirror circuit 63a to the n-channel enhancement type gate transistor 62a and the third current mirror circuit 64, respectively. Similarly, the second current mirror circuit 63b is implemented by two p-channel enhancement type field effect transistors Qp63 and Qp64, and currents passing through these transistors Qp63 and Qp64 are varied with the voltage level at the drain node N4 of the p-channel enhancement type field effect transistor Qp63. For this reason, the currents are also supplied from the second current mirror circuit 63b to the n-channel enhancement type gate transistor 62b and the third current mirror circuit 64. The third current mirror circuit 64 is implemented by two n-channel enhancement type field effect transistors Qn65 and Qn66 coupled between the p-channel enhancement type field effect transistors Qp62 and Qp64 and the ground voltage line, and the n-channel enhancement type field effect transistors Qn65 and Qn66 are gated by the drain node N5 of the n-channel enhancement type field effect transistor Qn66. The dimensions of the n-channel enhancement type field effect transistor Qn65 are smaller than the dimensions of the n-channel enhancement type field effect transistor Qn66. However, currents passing through the transistors Qn65 and Qn66 are dominated by the voltage level at the drain node N5 of the n-channel enhancement type field effect transistor Qn66, and the voltage level at the drain node N6 becomes higher than the voltage level at the drain node N5 as long as the currents are supplied from both first and second current mirror circuits 63a and 63b. The voltage level at the drain node N6 is relayed to the output inverting circuit 65. The voltage level at the drain node N6 of the transistor Qn65 is indicative of the complementary logic level of a data bit read out from one of the non-volatile memory cells M11 to Mmn, and the output inverting circuit 65 produces an output data signal Dout at the data output node OUT.

Description is hereinbelow made on circuit behaviors of the prior art electrically programmable read only memory device with reference to FIGS. 2 and 3 on the assumption that row address bits and column address bits sequentially select the non-volatile memory cell M11 in the erased state and the non-volatile memory cell Mm1 in the programmed state. Since the n-channel enhancement type field effect transistor Q51 and n-channel floating gate type field effect transistor Q52 are turned on, the voltage level at the reference node N2 remains in low voltage level, and the inverting circuit 61b produces the output voltage signal higher than the sum of the voltage level at the reference node N2 and the threshold level of the n-channel enhancement type field effect transistor 62b. Then, the n-channel enhancement type field effect transistor 62b turns on, and the drain node N4 is lower than the difference between the positive power voltage level Vcc and the threshold level of the p-channel enhancement type field effect transistor 63b. For this reason, both p-channel enhancement type field effect transistors Qp63 and Qp64 turn on, and the p-channel enhancement type field effect transistor Qp64 allows the n-channel enhancement type field effect transistor Qn66 to turn on. I1 is assumed to be the amount of current passing through the p-channel enhancement type field effect transistor Qp63, and the amount of current I2 passing through the p-channel enhancement type field effect transistor Qp63 is given as $$I2 = I1 \times (DM64/DM63) \qquad \text{Equation 1}$$

where DM64 is the dimensions of the p-channel enhancement type field effect transistor Qp64 and DM63 is the dimensions of the p-channel enhancement type field effect transistor Qp63. Since the current I2 passes through not only the p-channel enhancement type field effect transistor Qp64 but also the n-channel enhancement type field effect transistor Qn66, the voltage level at the drain node N5 is given by using proportional distribution on the basis of the channel resistances of the p-channel enhancement type field effect transistor Qp64 and the n-channel enhancement type field effect transistor Qn66, and the voltage level a the drain node N5 serves as a reference voltage level.

If the memory cell M11 in the erased state is accessed at time t1, the row address decoding unit 2 decodes the row address bits indicative of the word line WL1, and the word line WL1 is allowed to go up to active high voltage level of the positive power voltage level. With the column address bits indicative of the digit line DL1, the column address decoding unit 4 causes the decoded signal line DS1 to go up to the active high voltage level. The n-channel enhancement type transfer transistors Q31 turns on to couple the data input node N1 with the digit lines DL1. A current path is established from the data input node N1 through the column selector unit 3 to the digit line DL1, and the data input node N1 is decayed due to accumulation of the parasitic capacitance coupled to the digit line DL1. The inverting circuit 61a supplies the high voltage level to the gate electrode of the n-channel enhancement type field effect transistor 62a, and the n-channel enhancement type field effect transistor 62a turns on so as to couple the drain node N3 with the data input node N1. For this reason, the drain node N3 is transiently decayed at time t2. However, the drain node N3 thus decayed allows the p-channel enhancement type field effect transistor 63a to turn on, and is, accordingly, recovered to a predetermined voltage level lower than the difference between the positive power voltage level and the threshold level of the p-channel enhancement type field effect transistor 63a at time t4. The memory cell M11 or the n-channel floating gate type field effect transistor in the erased state provides a current path from the digit line DL1 to the ground voltage line, and the digit line DL1 and, accordingly, the data input node N1 become stable at the low voltage levels. The drain node N3 further allows the p-channel enhancement type field effect transistor Qp62 to turn on, and the first current mirror circuit 63a supplies current I4 to the third current mirror circuit 64. The current I4 to the third current mirror circuit 64 is given as $$I4 = I3 \times (DM62/DM61) \qquad \text{Equation 2}$$

where DM62 is the dimensions of the p-channel enhancement type field effect transistor Qp62 and DM61 is the dimensions of the p-channel enhancement type field effect transistor Qp61. As described hereinbefore, the voltage level at the drain node N6 becomes higher than the voltage level at the drain node N5, and, for this reason, the inverting circuit 65 starts on decreasing the voltage level of the output data signal Dout at time t3.

Subsequently, assuming now that the memory cell Mm1 in the programmed state is accessed as shown in FIG. 3, the row address decoder unit 2 and the column address decoder unit 4 respectively lift the decoded signal line DS1 and the word line WLm at time t11, and the data input node N1 is decayed due to accumulation of the parasitic capacitance coupled with the digit line DL1, thereby allowing the inverting circuit 61a to shift the n-channel enhancement type field effect transistor 62a to turn on. Since the drain node N3 is coupled through the n-channel enhancement type field effect transistor 62a with the digit line DL1, the drain node N3 is decayed at time t12. However, the memory cell Mm1 or the n-channel floating gate type field effect transistor is in the programed state, and no current path is established between the digit line DL1 and the ground voltage line. For this reason, the digit line DL1 and, accordingly, the data input node N1 is recovered to the high voltage levels after the accumulation of the parasitic capacitance, and the inverting circuit 61a decreases the output voltage signal lower than the sum of the voltage level at the data input node N1 and the threshold level of the n-channel enhancement type field effect transistor 62a. The n-channel enhancement type field effect transistor 62a turns off, and the drain node N3 is increased in the voltage level to the difference between the positive power voltage level and the threshold level of the p-channel enhancement type field effect transistor Qp61 at time t13. Since the p-channel enhancement type field effect transistor Qp62 transiently turns on together with the p-channel enhancement type field effect transistor Qp61, the voltage level at the drain node N6 is slightly decayed at time t14. However, the drain node N3 recovered to the high voltage level causes not only the p-channel enhancement type field effect transistor Qp61 but also the p-channel enhancement type field effect transistor Qp62 to turn off, and the drain node N6 as well as the output data signal Dout are recovered to the high voltage level.

Thus, the output data signal Dout is shifted between the low and high voltage levels depending upon the state of the accessed memory cell. As described hereinbefore, the memory cells M11 to Mmn enter the erased state through radiation of ultra-violet light, and injection of electrons is selectively carried out so as to establish memory cells into the programmed state. If the amount of injected electrons are too small to increase the threshold level, the memory cell unintentionally provides a current path, and the opposite logic level is memorized in the memory cell. In order to surely establish a memory cell in the programmed state, it is necessary to increase the voltage level of the write-in signal or to prolong time period for the programming. However, a large bootstrapping circuit is required for an increased write-in voltage level, and occupies a substantial amount of real estate. This results in reduction of integration density of the memory cell array 1. On the other hand, if the time period for a single programming operation is prolonged, the total amount of time period is increased together with the integration density of the memory cell array 1, and it is not convenient for a programmer.

SUMMARY OF THE INVENTION

It is therefore an important object of the present invention to provide a non-volatile semiconductor memory device which can complete programming within relatively short time period without increased write-in voltage level.

To accomplish the object, the present invention proposes to increase differential voltage level between output nodes of first and second current mirror circuits.

In accordance with the present invention, there is provided a non-volatile semiconductor memory device comprising: a) a memory cell array implemented by a plurality of addressable non-volatile memory cells arranged in rows and columns, and each having one of high and low threshold levels depending upon logic level of a data bit stored therein; b) addressing means provided in association with the memory cell array, and selecting one of the plurality of addressable non-volatile memory cells for producing a read-out data signal of either high or low voltage level at an output node thereof, the read-out data signal being indicative of the threshold level of the aforesaid one of the plurality of addressable non-volatile memory cells; c) a reference unit operative to produce a reference voltage level regulated between the high and low voltage level of the read-out data signal at an output node thereof; and d) a sense amplifier unit comprising d-1) a data input node coupled with the output node of the addressing means, d-2) a reference node coupled with the output node of the reference unit, d-3) a first gate transistor having a drain node coupled with the data input node, d-4) a second gate transistor having a drain node coupled with the reference node, d-5) a first inverting circuit having an input node coupled with the data input node, and an output node coupled with a gate electrode of the first gate transistor, d-6) a second inverting circuit having an input node coupled with the reference node, and an output node coupled with a gate electrode of the second gate transistor, d-7) a first current mirror circuit coupled between a source of current and a source node of the first gate transistor for controlling a first current, d-8) a second current mirror circuit coupled between the source of current and a source node of the second gate transistor for controlling a second current, d-9) a third current mirror circuit having first and second input nodes respectively supplied with the first and second currents, and responsive to a voltage level converted from the second current for controlling a voltage level at the first input node thereof, and d-10) a differential amplifier circuit responsive to a differential voltage level between the first and second input nodes for producing an output data signal.

BRIEF DESCRIPTION OF THE DRAWINGS

The feature and advantages of the non-volatile semiconductor memory device according to the present invention will be more clearly understood from the following description taken in conjunction with the accompanying drawings in which.

DESCRIPTION OF THE PREFERRED EMBODIMENT

Figure 4:
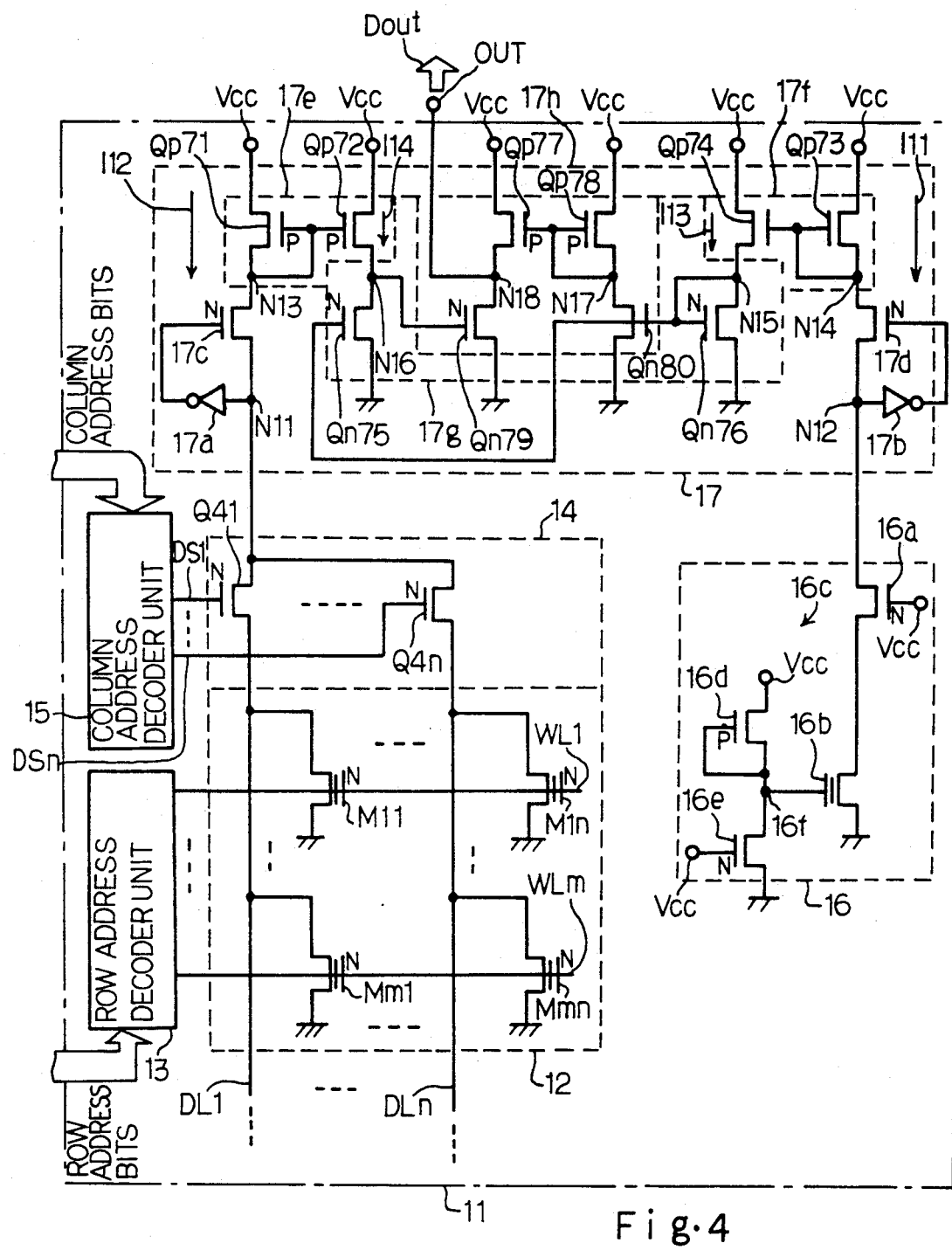
FIG. 4 is a circuit diagram showing the arrangement of a non-volatile semiconductor memory device according to the present invention.

Referring to FIG. 4 of the drawings, a electrically programmable read only memory device embodying the present invention is fabricated on a single semiconductor chip 11, and largely comprises a memory cell array 12 associated with word lines WL1 to WLm as well as with digit line DL1 to DLn, a row address decoding unit 13 coupled with the word lines WL1 to WLm, a column selecting unit 14 coupled with the digit lines DL1 to DLn, a column address decoding unit 15 coupled with the column selecting unit 14 through decoded signal lines DS1 to DSn, a reference unit 16 and a sense amplifier unit 17.

Figure 1:
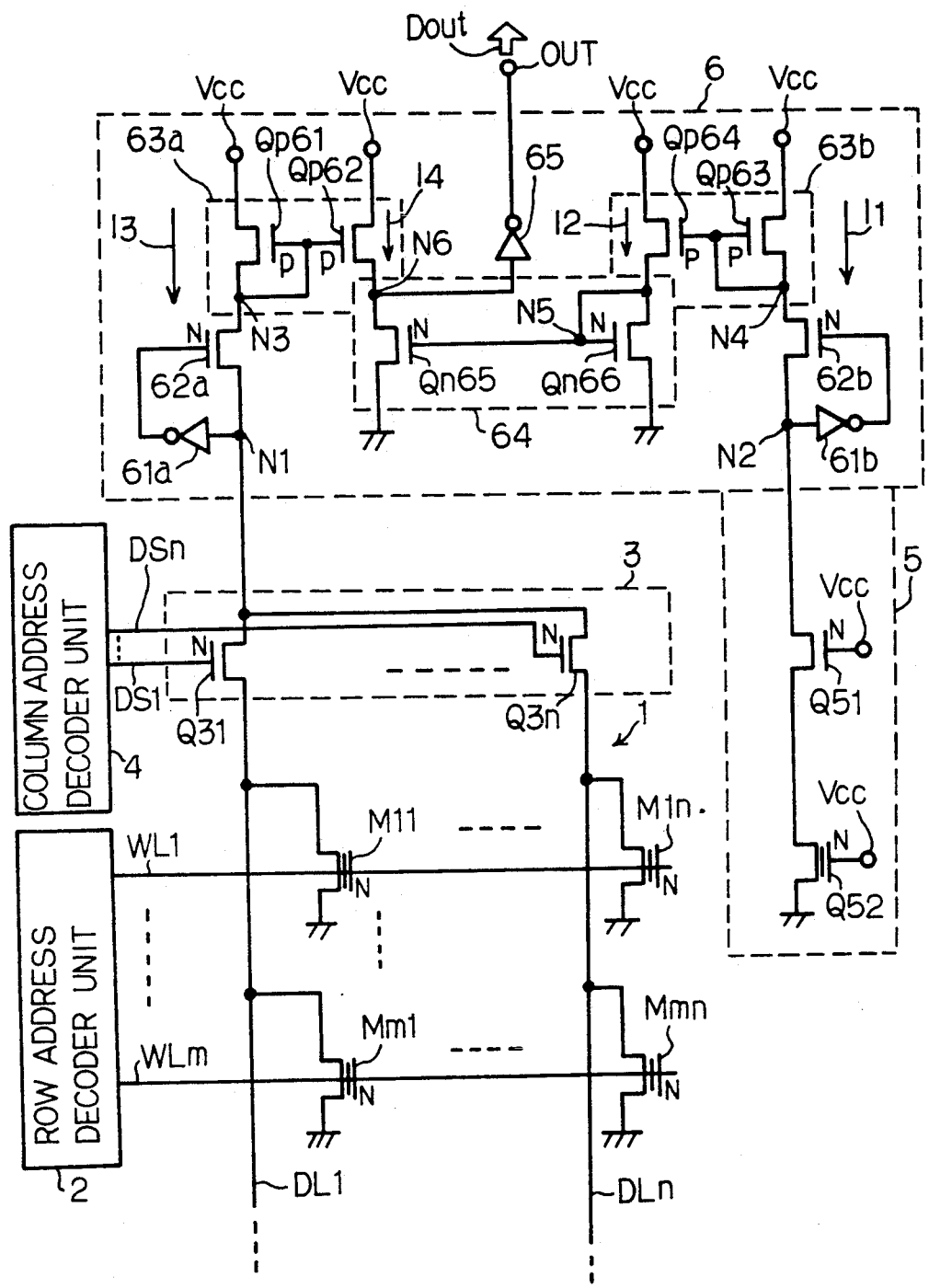
FIG. 1 is a circuit diagram showing the arrangement of the prior art non-volatile semiconductor memory device.
Figure 2:
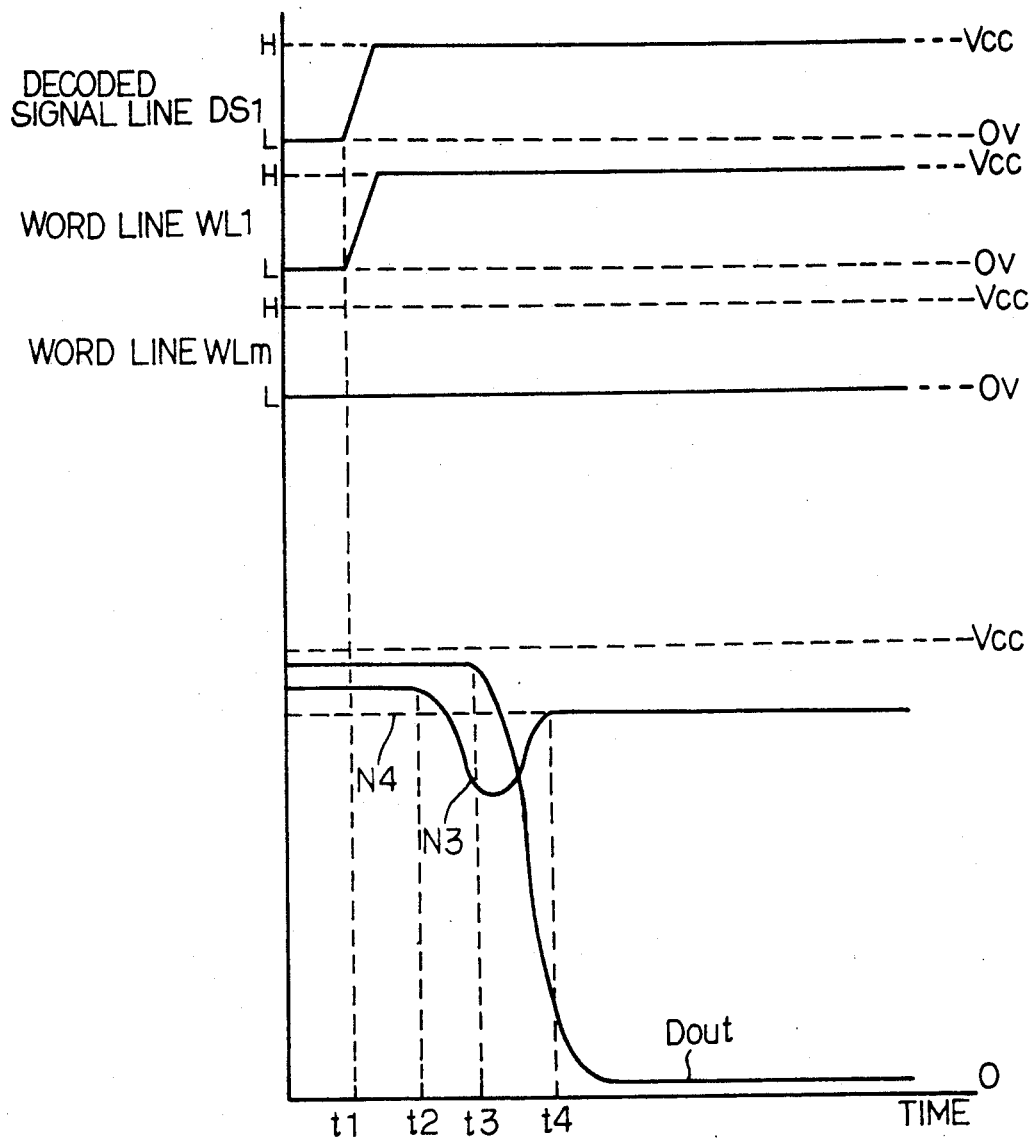
FIG. 2 is a graph showing the waveforms of voltage levels at essential nodes of the prior art non-volatile semiconductor memory device.
Figure 3:
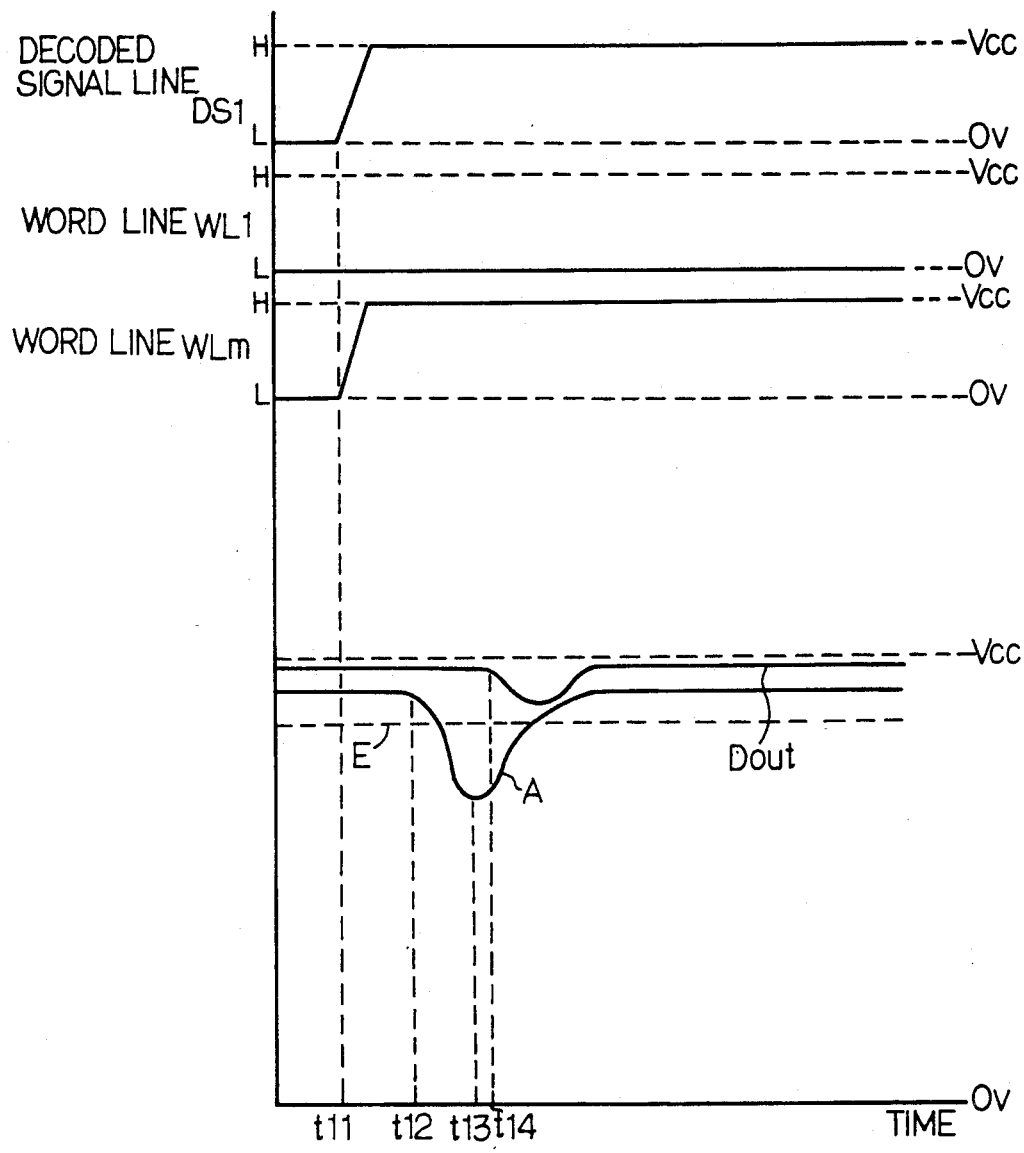
FIG. 3 is a graph showing the waveforms of voltage levels at essential nodes of the prior art non-volatile semiconductor memory device.

The memory cell array 12 is constituted by a plurality of non-volatile memory cells M11, M1n, Mm1 and Mmn arranged in rows and columns, and each of the non-volatile memory cells M11 to Mmn is implemented by an n-channel floating gate type field effect transistor. The n-channel floating gate type field effect transistors selectively enter erased state and programmed state, and the programmed state and the erased state are respectively corresponding to logic "1" level and logic "0" level at a data output node OUT. In order to memorize a data bit of logic "1" level into one of the non-volatile memory cells M11 to Mmn, electrons are injected into the floating gate electrode of the n-channel floating gate type field effect transistor of the memory cell under application of a write-in signal, and, accordingly, the non-volatile memory cell enters the programmed state featured by a relatively high threshold level. However, the amount of electrons accumulated in the floating gate electrode is smaller than that of the prior art electrically programmable read only memory device shown in FIG. 1. In other words, time period for each programming operation is shrunk rather than that of the prior art without increase of the voltage level of the write-in signal. In this instance, the write-in signal is about 12 volts, and is applied to a memory cell for about 50 milliseconds. The prior art electrically programmable read only memory device requires the write-in signal at 17 volts for 100 milliseconds, and the programming characteristics are surely improved. The reason why the relatively small amount of injected electrons allow the sense amplifier unit 17 to discriminate the threshold level of an accessed memory cell will be described in conjunction with the circuit arrangement of the sense amplifier unit 17.

On the other hand, when ultra-violet light is radiated onto the memory cell array 12, electrons are evacuated from the floating gate electrodes of all the n-channel floating gate type field effect transistors, and the non-volatile memory cells M11 to Mmn simultaneously enter the erased state featured by a relatively low threshold level.

The rows of the memory cell array 12 are associated with the word lines WL1 to WLm, and the word lines WL1 to WLm are coupled with the control gate electrodes of the associated n-channel floating gate type field effect transistors. The digit lines DL1 to DLn are respectively associated with the columns of the memory cell array 12, and are coupled with drain nodes of the associated n-channel floating gate type field effect transistors. The digit lines DL1 to DLn are terminated at the column selector unit 14, and the column selector unit 14 are implemented by a plurality of n-channel enhancement type field effect transistors Q41 to Q4n coupled with the digit lines DL1 to DLn. The source nodes of all the n-channel floating gate type field effect transistors are coupled with a common source line at the ground voltage level.

When row address bits are supplied to the row address decoder unit 13, the row address decoder unit 13 lifts one of the word lines WL1 to WLm to a read-out voltage level regulated between the high threshold level and the low threshold level, and the associated n-channel floating gate type field effect transistors selectively turn on depending upon the state thereof. Namely, the n-channel floating gate type field effect transistors in the erased state couple the associated digit lines DL1 to DLn with the common source voltage line. The column address decoder unit 4 is responsive to column address bits, and allows one of the n-channel enhancement type field effect transistors Q41 to Q4n to turn on. As a result, the column selector unit 14 interconnects one of the digit lines DL1 to DLn and a data input node N11 of the sense amplifier unit 17.

The reference unit 16 is implemented by a series combination of an n-channel enhancement type field effect transistor 16a and an n-channel floating gate type field effect transistor 16b accompanied with a constant voltage producing circuit 16c. The series combination of the two transistors 16a and 16b is coupled between a reference node N12 of the sense amplifier unit 17 and the common source voltage line. If a constant control voltage level is applied to both floating gate type field effect transistors, the n-channel floating gate type field effect transistor 16b is approximately equal in current driving capability to each of the n-channel floating gate type field effect transistors of the memory cell array 12. The n-channel enhancement type field effect transistor 16a is approximately equal in dimensions and, accordingly, in current driving capability to each of the n-channel enhancement type field effect transistors Q41 to Q4n. A positive power voltage level is applied to the gate electrode of the n-channel enhancement type field effect transistor 16a, and a constant voltage level is supplied from the constant voltage producing circuit 16c to the control gate electrode of the n-channel floating gate type field effect transistor 16b. The constant voltage producing circuit 16c is implemented by a series combination of a p-channel enhancement type load transistor 16d and an n-channel enhancement type field effect transistor 16e, and the positive power voltage level Vcc is supplied to the gate electrode of the n-channel enhancement type field effect transistor 16e. The constant voltage level at the output node 16f keeps the channel conductance of the n-channel floating gate type field effect transistor 16b constant, and circuit parameters of the constant voltage producing circuit 16c are regulated in such a manner that a voltage level at the drain node of the n-channel floating gate type field effect transistor 16b is higher than the voltage level at the drain node of an n-channel floating gate type field effect transistor in the erased state and lower than the voltage level at the drain node of an n-channel floating gate type field effect transistor in the programmed state. In other words, the following inequality is established $$(V_{cc} - Vth_{program}) < (V_{cc} - Vth_{16d} - Vth_{16b}) < (V_{cc} - Vth_{erase})$$

where $Vth_{program}$ is the threshold level of a n-channel floating gate type field effect transistor in the programmed state, $Vth_{erase}$ is the threshold level of a n- channel floating gate type field effect transistor in the erased state, $Vth_{16b}$ is the threshold level of the p-channel enhancement type load transistor 16d, $Vth_{16b}$ is the threshold level of the n-channel floating gate type field effect transistor 16b approximately equal to $Vth_{erase}$. For this reason, a reference voltage level at the reference node N12 is regulated between the voltage level at the data input node N11 upon access to a memory cell in the erased state and the voltage level at the data input node N11 upon access to a memory cell in the programmed state.

The sense amplifier unit 17 comprises two inverting circuits 17a and 17b coupled at the input nodes thereof with the data input node N11 and the reference node N12, two n-channel enhancement type gate transistors 17c and 17d respectively gated by the inverting circuits 17a and 17b, first and second current mirror circuits 17e and 17f coupled between a power voltage source Vcc and the n-channel enhancement gate transistors 17c and 17d, a third current mirror circuit 17g associated with the first and second current mirror circuits 17e and 17f, and a differential amplifier circuit 17h coupled between the third current mirror circuit 17g and the data output node OUT. The n-channel enhancement type gate transistors 17c and 17d are approximately equal in dimensions and, accordingly, current driving capability to each other, and the inverting circuits 17a and 17b are also equal in converting characteristics to each other.

The first current mirror circuit 17e is implemented by a pair of p-channel enhancement type field effect transistors Qp71 and Qp72, and the gate electrodes of the pair of p-channel enhancement type field effect transistors Qp71 and Qp72 are coupled with the drain node N13 of the p-channel enhancement type field effect transistor Qp71. The amount of current passing through each p-channel enhancement type field effect transistor Qp71 or Qp72 is varied with the voltage level at the drain node N13, and currents are supplied from the first current mirror circuit 17e to the n-channel enhancement type gate transistor 17c and the third current mirror circuit 17g, respectively. Similarly, the second current mirror circuit 17f is implemented by two p-channel enhancement type field effect transistors Qp73 and Qp74, and currents passing through these transistors Qp73 and Qp74 are varied with the voltage level at the drain node N14 of the p-channel enhancement type field effect transistor Qp73. For this reason, the currents are also supplied from the second current mirror circuit 17f to the n-channel enhancement type gate transistor 17d and the third current mirror circuit 17g. The p-channel enhancement type field effect transistors Qp71 to Qp74 are approximately equal in dimensions and, accordingly, current driving capability to one another. The third current mirror circuit 17g is implemented by two n-channel enhancement type field effect transistors Qn75 and Qn76 coupled between the p-channel enhancement type field effect transistors Qp72 and Qp74 and the common source line, and the n-channel enhancement type field effect transistors Qn75 and Qn76 are gated by the drain node N15 of the n-channel enhancement type field effect transistor Qn76. The drain node N15 and the drain node of the n-channel enhancement type field effect transistor N16 serves as a pair of input nodes of the third current mirror circuit 17g.

The differential amplifier circuit 17h comprises two series combinations of p-channel enhancement type field effect transistors Qp77 and Qp78 and n-channel enhancement type field effect transistors Qn79 and Qn80 both coupled between the positive power voltage line Vcc and a ground voltage line. The gate electrodes of the p-channel enhancement type field effect transistors Qp77 and Qp78 are coupled with the drain node N17 of the p-channel enhancement type field effect transistor Qp78, and both p-channel enhancement type field effect transistors Qp77 and Qp78 serve as load transistors. The gate electrodes of the n-channel enhancement type field effect transistors Qn79 and Qn80 have respective gate electrodes coupled with the drain nodes or the input nodes N16 and N17 of the current mirror circuit 17g. The common drain node N18 of the field effect transistors Qp77 and Qn79 is coupled with the data output node OUT. The p-channel enhancement type field effect transistors Qp77 and Qp78 are approximately equal in dimensions and, accordingly, current driving capability to each other, and the n-channel enhancement type field effect transistors Qn79 and Qn80 are also approximately equal in dimensions and, accordingly, current driving capability to one another.

Since the voltage level at the reference node N12 is regulated between the voltage level at the input node N11 upon access to a memory cell in the erased state and the voltage level at the input node N11 upon access to a memory cell in the programmed state, the amount of current I11 passing through the p-channel enhancement type field effect transistor Qp73 is different from the amount of current I12 passing through the p-channel enhancement type field effect transistor Qp71 even if a memory cell in the erased state is accessed. This results in that the amount of current I3 supplied from the second current mirror circuit 17f to the third current mirror circuit 17g is different from the amount of current I4 supplied from the first current mirror circuit 17e to the third current mirror circuit 17g. Therefore, small differential voltage level takes place between the pair of input nodes N15 and N16 of the third current mirror circuit 17g, and the differential amplifier circuit 17h increases the small differential voltage level so as to produce the output data signal Dout. Thus, the sense amplifier unit 17 is responsive to small differential voltage level, and, for this reason, only a small amount of injected electrons or small difference in threshold level is discriminative by the sense amplifier unit 17.

Figure 5:
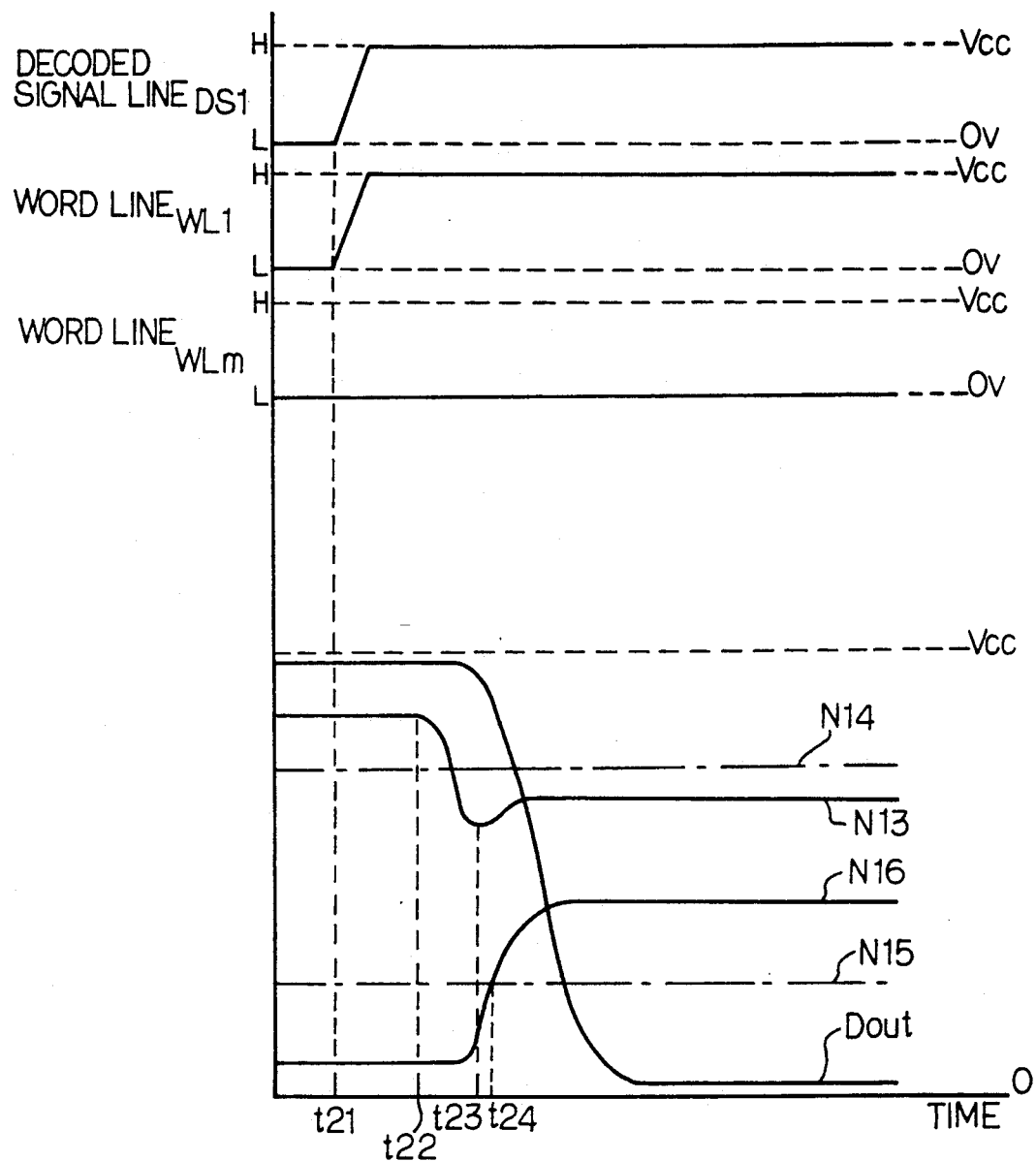
FIG. 5 is a graph showing the waveforms of voltage levels at essential nodes of the non-volatile semiconductor memory device shown in FIG. 4.

Description is hereinbelow made on circuit behaviors of the electrically programmable read only memory device with reference to FIGS. 5 and 6 on the assumption that the row address bits and column address bits sequentially select the memory cell M11 in the erased state and the memory cell Mm1 in the programmed state. Since the reference unit 16 allows constant current I11 to flow therethrough at all times, the voltage level at the drain node N14 is substantially constant as indicated by Plots N14.

If the memory cell M11 in the erased state is accessed at time t21, the row address decoding unit 13 decodes the row address bits indicative of the word line WL1, and the word line WL1 is allowed to go up to active high voltage level of the positive power voltage level. With the column address bits indicative of the digit line DL1, the column address decoding unit 15 causes the decoded signal line DS1 to go up to the active high voltage level. The n-channel enhancement type transfer transistors Q41 turns on to couple the data input node N11 with the digit lines DL1. A current path is established from the data input node N11 through the column selector unit 14 to the digit line DL1, and the data input node N11 is decayed due to accumulation of the parasitic capacitance coupled to the digit line DL1. The inverting circuit 17a supplies the high voltage level to the gate electrode of the n-channel enhancement type field effect transistor 17c, and the n-channel enhancement type field effect transistor 17c turns on so as to couple the drain node N13 with the data input node N11 and, accordingly, with the digit line DL1. For this reason, the drain node N13 is transiently decayed at time t22. However, the drain node N13 thus decayed allows the p-channel enhancement type field effect transistor Qp71 to turn on, and is, accordingly, recovered toward a predetermined voltage level lower than the voltage level at the drain node N14 at time t23, because the accessed memory cell M11 is larger in current driving capability than the n-channel floating gate type field effect transistor 16b due to difference in voltage level between the control gate electrodes. The drain node N13 further allows the p-channel enhancement type field effect transistor Qp72 to turn on, and the first current mirror circuit 17e supplies current I14 to the input node N16 of the third current mirror circuit 17g. For this reason, the input node N16 starts on increasing the voltage level, and exceeds the voltage level at the input node N15 of the third current mirror circuit 17g. Thus, differential voltage level takes place between the input nodes N15 and N16, and the differential amplifier circuit 17h causes the output data signal Dout to go down.

Figure 6:
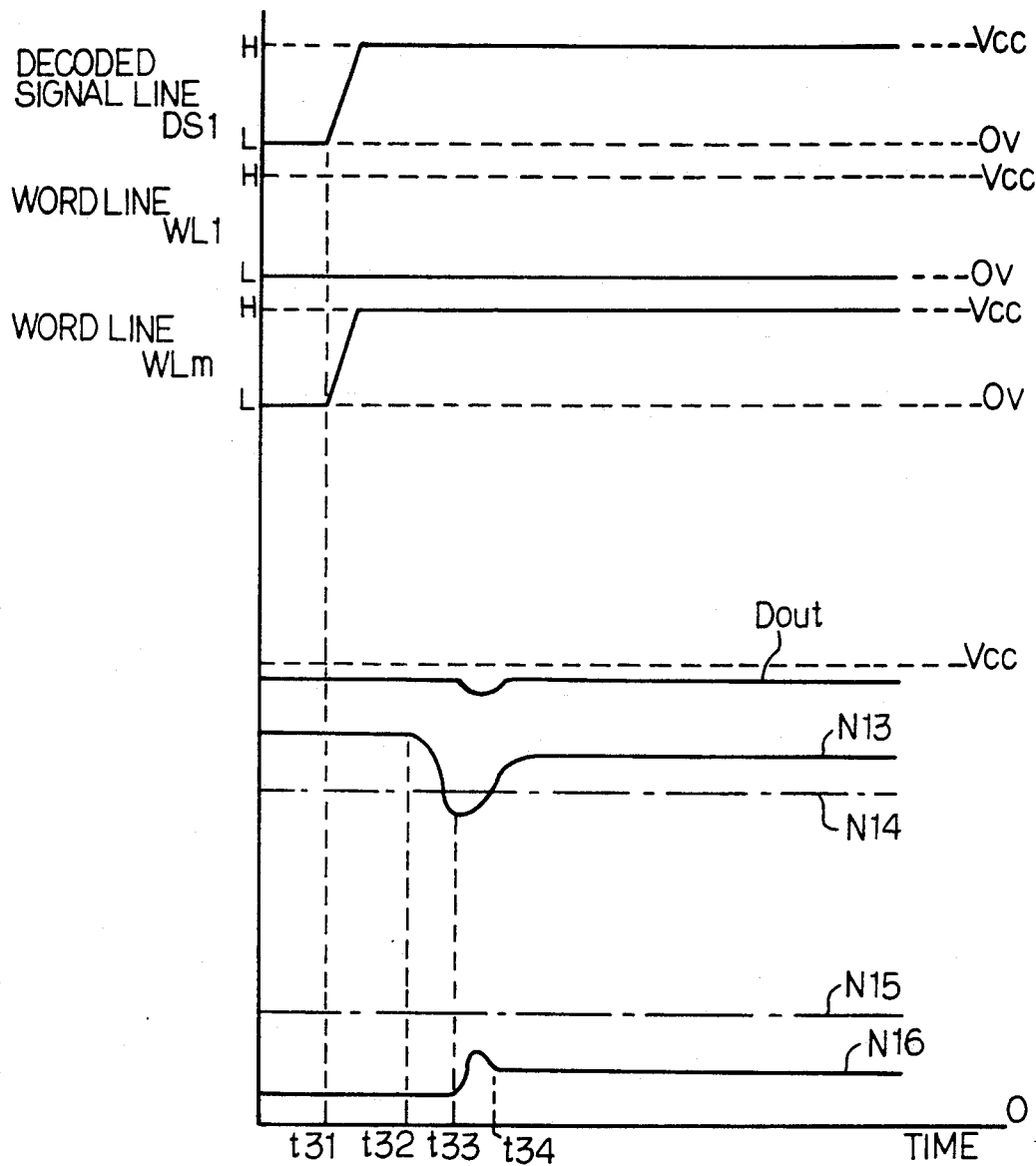
FIG. 6 is a graph showing the waveforms of voltage levels at essential nodes of the non-volatile semiconductor memory device shown in FIG. 4.

Subsequently, assuming now that the memory cell Mm1 in the programmed state is accessed as shown in FIG. 6, the row address decoder unit 13 and the column address decoder unit 15 respectively lift the decoded signal line DS1 and the word line WLm at time t31, and the data input node N11 is decayed due to accumulation of the parasitic capacitance coupled with the digit line DL1, thereby allowing the inverting circuit 17a to shift the n-channel enhancement type field effect transistor 17c to turn on. Since the drain node N13 is coupled through the n-channel enhancement type field effect transistor 17c with the digit line DL1, the drain node N13 is decayed at time t32. However, the memory cell Mm1 or the n-channel floating gate type field effect transistor is in the programed state, and the memory cell Mm1 is smaller in channel conductance than the memory cell M11 as well as the n-channel floating gate type field effect transistor 16b. For this reason, the digit line DL1 and the data input node N11 are recovered toward respective high voltage level higher than the voltage level after the accumulation of the parasitic capacitance, and the inverting circuit 17a decreases the output voltage signal so that the n-channel enhancement type field effect transistor 17c turns off. The drain node N13 is increased in the voltage level toward a voltage level higher than the voltage level at the drain ode N14 at time t33. The drain node N3 recovered to the higher voltage level causes not only the p-channel enhancement type field effect transistor Qp71 but also the p-channel enhancement type field effect transistor Qp72 to turn off, and the input node N16 becomes stable at a voltage level lower than the voltage level at the input node N15 at time t34. Thus, differential voltage level takes place between the input nodes N15 and N16, and the differential amplifier circuit 17h produces the output data signal Dout of the high voltage level.

As will be understood from the foregoing description, the electrically programmable read only memory device according to the present invention is equipped with the differential amplifier circuit 17h associated with the third current mirror circuit 17g, and small difference between the high threshold level and the low threshold level becomes discriminative. For this reason, a memory cell accumulates a relatively small amount of injected electrons, and the programming is completed within short time period without increase of the write-in voltage level.

Although particular embodiments of the present invention have been shown and described, it will be obvious to those skilled in the art that various changes and modifications may be made without departing from the spirit and scope of the present invention. For example, the sense amplifier unit according to the present invention is applicable to an electrically erasable and programmable read only memory device.

What is claimed is:

1. A non-volatile semiconductor memory device comprising:
   a) a memory cell array implemented by a plurality of addressable non-volatile memory cells arranged in rows and columns, and each having one of high and low threshold levels depending upon logic level of a data bit stored therein;
   b) addressing means provided in association with said memory cell array, and selecting one of said plurality of addressable non-volatile memory cells for producing a read-out data signal of either high or low voltage level at an output node thereof, said read-out data signal being indicative of the threshold level of said one of said plurality of addressable non-volatile memory cells;
   c) a reference unit operative to produce a reference voltage level regulated between said high and low voltage level of said read-out data signal at an output node thereof; and
   d) a sense amplifier unit comprising d-1) a data input node coupled with said output node of said addressing means, d-2) a reference node coupled with said output node of said reference unit, d-3) a first gate transistor having a drain node coupled with said data input node, d-4) a second gate transistor having a drain node coupled with said reference node, d-5) a first inverting circuit having an input node coupled with said data input node, and an output node coupled with a gate electrode of said first gate transistor, d-6) a second inverting circuit having an input node coupled with said reference node, and an output node coupled with a gate electrode of said second gate transistor, d-7) a first current mirror circuit coupled between a source of current and a source node of said first gate transistor for controlling a first current, d-8) a second current mirror circuit coupled between said source of current and a source node of said second gate transistor for controlling a second current, d-9) a third current mirror circuit having first and second input nodes respectively supplied with said first and second currents, and responsive to a voltage level converted from said second current for controlling a voltage level at said first input node thereof, and d-10) a differential amplifier circuit responsive to a differential voltage level between said first and second input nodes for producing an output data signal.

2. A non-volatile semiconductor memory device as set forth in claim 1, in which each of said plurality of addressable non-volatile memory cells is implemented by a floating gate type field effect transistor.

3. A non-volatile semiconductor memory device as set forth in claim 1, in which said addressing means comprises b-1) a row address decoder unit responsive to row address bits for selecting one of said rows of said memory cell array, b-2) a column selector unit implemented by a plurality of gate transistors, and coupled between said memory cell array and said sense amplifier unit, and b-3) a column address decoder unit responsive to column address bits for allowing said column selector unit to couple one of said columns of said memory cell array with said data input node of said sense amplifier unit.

4. A non-volatile semiconductor memory device as set forth in claim 3, in which said reference unit comprises c-1) a series combination of a dummy gate transistor and a dummy memory cell coupled between said reference node and a first constant voltage source, said dummy gate transistor being equal in current driving capability to each of said a plurality of gate transistors, said dummy memory cell being equal in current driving capability to each of said addressable non-volatile memory cells, and c-2) a constant voltage producing circuit having an output node coupled with a control gate electrode of said dummy memory cell for producing a first predetermined voltage level at a drain node of said dummy memory cell, said first predetermined voltage level being regulated between a second predetermined voltage level at a drain node of one of said plurality of addressable non-volatile memory cells with said high threshold level and a third predetermined voltage level at a drain node of another addressable non-volatile memory cell with said low threshold level.

5. A non-volatile semiconductor memory device as set forth in claim 1, in which said first current mirror circuit comprises first and second enhancement type field effect transistors coupled in parallel between a first constant voltage source and said first gate transistor and said first input node, said first and second enhancement type field effect transistors having respective gate electrodes coupled with a drain node of said first enhancement type field effect transistor.

6. A non-volatile semiconductor memory device as set forth in claim 5, in which said second current mirror circuit comprises third and fourth enhancement type field effect transistors coupled in parallel between said first constant voltage source and said second gate transistor and said second input node, said third and fourth enhancement type field effect transistors having respective gate electrodes coupled with a drain node of said third enhancement type field effect transistor.

7. A non-volatile semiconductor memory device as set forth in claim 6, in which said third current mirror circuit comprises a fifth enhancement type field effect transistor coupled between said first input node and a second constant voltage source, and a sixth enhancement type field effect transistor coupled between said second input node and said second constant voltage source, said fifth and sixth enhancement type field effect transistors having respective gate electrodes coupled with said second input node.

8. A non-volatile semiconductor memory device as set forth in claim 7, in which said differential amplifier circuit comprises a first series combination of a first load transistor and a first amplifying transistor coupled between said first and second constant voltage sources, and a second series combination of a second load transistor and a second amplifying transistor coupled between said first and second constant voltage sources, said first and second amplifying transistors having respective gate electrodes coupled with said first and second input nodes, respectively.

* * * * *